United States Patent [19]

Heydlauff

[11] Patent Number: 4,593,317

[45] Date of Patent: Jun. 3, 1986

[54] MOVING SCENE DISPLAY FOR PASSIVE RADIATION-WAVE IMAGING SYSTEM

[75] Inventor: Bruce M. Heydlauff, Ridgecrest, Calif.

[73] Assignee: The United States of America as represented by the Secretary of the Navy, Washington, D.C.

[21] Appl. No.: 639,890

[22] Filed: Aug. 13, 1984

[51] Int. Cl.⁴ .............................................. H04N 7/18
[52] U.S. Cl. .................................... 358/140; 358/109; 358/113
[58] Field of Search ..................... 358/109, 113, 140; 343/55 C, 6 TV

[56] References Cited

U.S. PATENT DOCUMENTS

| 3,296,579 | 1/1967 | Farr et al. ............................. 340/3 |
| 3,550,123 | 12/1970 | Brown et al. ........................... 343/5 |
| 3,798,366 | 3/1974 | Hunt et al. ........................... 358/113 |
| 3,808,596 | 4/1974 | Kazel ........................... 343/100 ME |
| 3,992,707 | 11/1976 | Schmidtlein et al. ........... 343/5 CM |
| 4,164,740 | 8/1979 | Constant ........................ 343/5 CM |
| 4,439,788 | 3/1984 | Frame ................................ 358/109 |

Primary Examiner—Howard W. Britton
Attorney, Agent, or Firm—Robert F. Beers; W. Thom Skeer

[57] ABSTRACT

A system which processes analog signals from millimeter wave sensing system into digital words in an organized manner which are then stored into a data memory representing the pixels in the wave images. The pixels are read out at a rate and format to a standard television monitor thus providing a real time display of the sensed image.

3 Claims, 6 Drawing Figures

MOVING SCENE DISPLAY FOR PASSIVE RADIATION-WAVE IMAGING SYSTEM

BACKGROUND OF THE INVENTION

1. Field of the Invention

This invention relates to imaging systems. More particularly, this invention relates to millimeter-wave imaging systems. Most particularly, this invention processes analog signals from a sensor into digital words which are then stored into a data memory representing the pixels in the wave images. These pixels are then read out at a rate and in a format observable on a standard television monitor.

2. Description of the Prior Art

There are various available wave imaging systems, none of which is capable of accomplishing the objective of the subject invention, that is, to provide a means for converting passive millimeter-wave information in real time to a standard television rate and format for monitoring and recording.

Of course, there are some conventional devices which are worthy of note inasmuch they at least remotely or indirectly concern subject matter that is pertinent to the circuitry constituting the instant moving scene display for passive radiation wave imaging system. One device uses contrast paper excited by ultraviolet radiation; however, this device has less than optimum dynamic range capabilities and does not keep a permanent record of the display. Another device uses modified storage tubes of the video-con types wherein the information is "written" into the tube for later retrieval. However, this device has a limited capacity due to the "blooming" effect which occurs as the input quantity increases and also has a limited dynamic range. Still another device writes information into the X-Y axes of a cathode ray tube which is exposed to polaroid film. Such process is time consuming and the film result is nonlinear providing limited application and dynamic range of the device. All the above mentioned devices have platform stability problems which require constant adjustments for pitch, yaw, roll and altitude of the platform.

There are devices utilizing passive radiometric mapping through the scan of infrared sensors but not with real time display. Others utilize radar range data with substantially real time display. Still other devices utilize sonar techniques of sensing with computer calculated displays which are not in real time.

None of the known devices discloses means for measuring radiation intensity, for converting the intensity signal into digital form, and for correcting the measured radiation for physical parameter variations, and a computer means for loading the data into a digital imaging board having a memory matrix and a television encoder as comprised by the instant invention.

SUMMARY OF THE INVENTION

The moving scene display for passive radiation wave imaging system in part utilizes conventional devices in a sophisticated way to achieve its objective. The objective of the imaging system is to provide a real time display of passive or natural radiation from the earth.

Passive millimeter-wave imaging expands visual capabilities. With this approach, images are obtainable through visual obscurities such as clouds, fog, snow, smoke, and dust.

The imaging system, viz., the present invention, processes analog signals from the imaging sensors via a radiometer which converts the received radiant energy into distinct electrical signals suitable for processing. These signals are processed into digital words that are stored in a data memory. From the data memory the signals are put into a format and sent out at a rate so that the sensed image becomes observable at real time on a standard television monitor or recordable on a video recorder for later observation. This system has satisfactory performance, low volume, low weight, and low cost.

The present imaging system may measure radiation from the earth's surface by scanning a pencil-beam antenna across the surface in an organized manner. After the sensed energy is transformed into an electronic signal, the latter is processed using positional information on the location of the intercept of the antenna beam with the earth's surface and the antenna's platform, i.e., aircraft position.

The electronic signals are sampled in a nonlinear fashion, digitized, and read into a microprocessor. The microprocessor functions as an elaborate bookkeeper and controller while loading digitized signals into a digital graphics board. The board contains a memory matrix. All the data in the matrix are read out at an appropriate rate to a gray-scale encoder and are formated for standard television video reception.

Further features of the system are numerous. One feature is contrast enhancement which is highlighting objects of interest by level slicing. In slicing, a particular gray scale is assigned to a power level. Further contrast enhancement is possible by reading out the contents of the matrix very slowly and plotting the contrast data. Gray levels may be increased in number by adding another digital graphics board. The information may be read out, through instructions to the microprocessor, from the graphics board at various rates and in different formats. The system can also be reconfigured to handle data from additional or different sensor systems.

Since information originates with the radiation sensor, organization and coordination are required within the system to produce an intelligible output. This requirement is met with the aid of a cross-track correction circuit in conjunction with positional information from the sensor or antenna system. The correction circuit causes the sampling of data to occur during the course of a scan in a controlled, nonlinear fashion in order to construct an image from data taken at locations equidistant on the earth's surface.

The cross-track correction circuit eliminates several deficiencies associated with other methods of removing topographically induced scanning distortions (as in FIG. 3), including both analog and digital computer methods. The primary deficiencies associated with analog methods are size, complexity, and inflexibility. Most computer methods are not fast enough to do the conversions in real time. The cross-track correction circuit is relative simple, very stable, and easily varied by reprogramming.

This circuit has been used for the geometrical correction of data obtained by a radiometric imager. It would similarly be useful for correcting data from any flying spot scanner functioning at a constant angular rate over a relatively constant field, whether optical or infrared, by programming the PROM's to correct for the particular field geometry encountered. The same circuit could be used to determine when to output data to a laser recording device using a flying spot generated by a reflection from a mirror spinning at a constant rate, or when to select the next pixel for output on a high accuracy system with fixed geometric errors.

The circuit is easily modified to produce a higher or lower number of data points by changing the counter and the transfer function in the PROM's. Depending on the inputs and the desired outputs, almost any monotonic transfer function can be programmed into the PROM's. If a different output is required, the transfer function might easily be changed, under microprocessor control on a scan-to-scan basis, by replacing the PROM's with high speed random access memory (RAM) interfaced to a computer.

Further features and advantages of the moving scene display for the passive radiation wave imaging system are described in the accompanying description of the preferred embodiment, attachment of drawing figures, and statement of claims.

DESCRIPTION OF THE DRAWING

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENT

Figure 1:
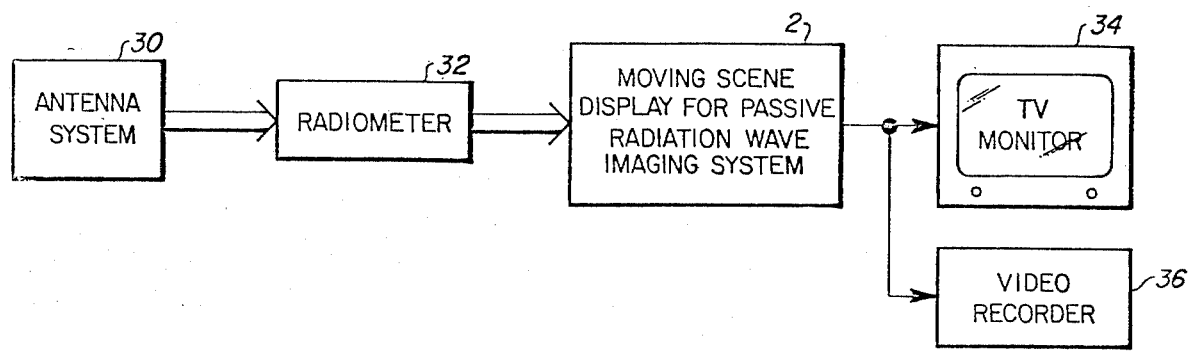
FIG. 1 is a block diagram showing the invention in conjunction with peripheral equipment.
Figure 5:
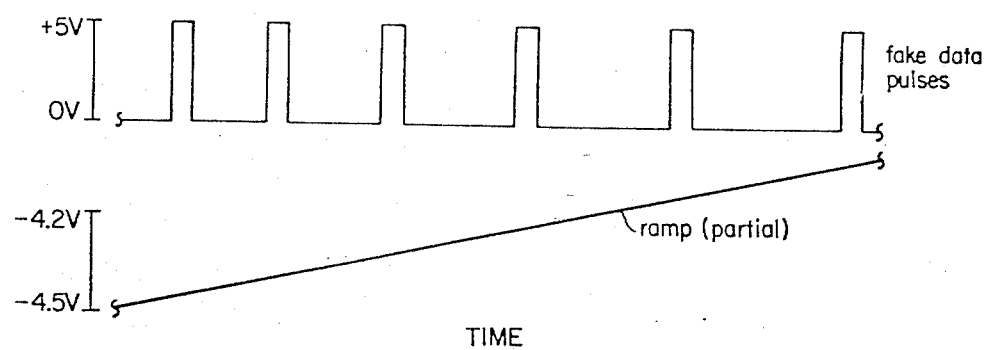
FIG. 5 illustrates frequency of take-data pulses with respect to the ramp signal.

To get an overview of the invention, the moving scene display for passive radiation wave imaging system 2, one looks at FIG. 1. On the input of the moving scene display system 2, one has the output of the radiometer 32 in which radiant energy from an antenna 30 in FIG. 1 is converted to distinct electrical signals. The energy which is converted to distinct electrical signals is picked up by the antenna system 30. The electrical signals from radiometer 32 may be transmitted directly via wires or through a wireless medium. Antenna system 30 of FIG. 1 receives passive radiation emanating from the earth. An example would be the three pencil beam receiving antennas 30 with each antenna having 120° displacement from the other. All three antennas rotate about a horizontal axis in which each antenna for one third of the revolution is scanning the earth. Scanning is done in an organized manner. At the beginning of each scan, a start pulse is sent out of the antenna system 30 via the radiometer 32 to the moving scene display system 2. Also coming out of the antenna system 30 is a ramp signal as shown in FIG. 5 which indicates the position of the scanning antenna 30 respectively. The system 2 in conjunction with the antenna is often referred to as a passive millimeter wave imaging system or a real time scan converter.

The output of the moving scene display for passive radiation wave imaging system 2 either goes to a television monitor 34 or to a video recorder 36. Television monitor 34 exhibits a standard television format and accepts a nonmodulated signal from imaging system 2. A video recorder 36 may be utilized to record images for later observation and analysis.

Figure 2:
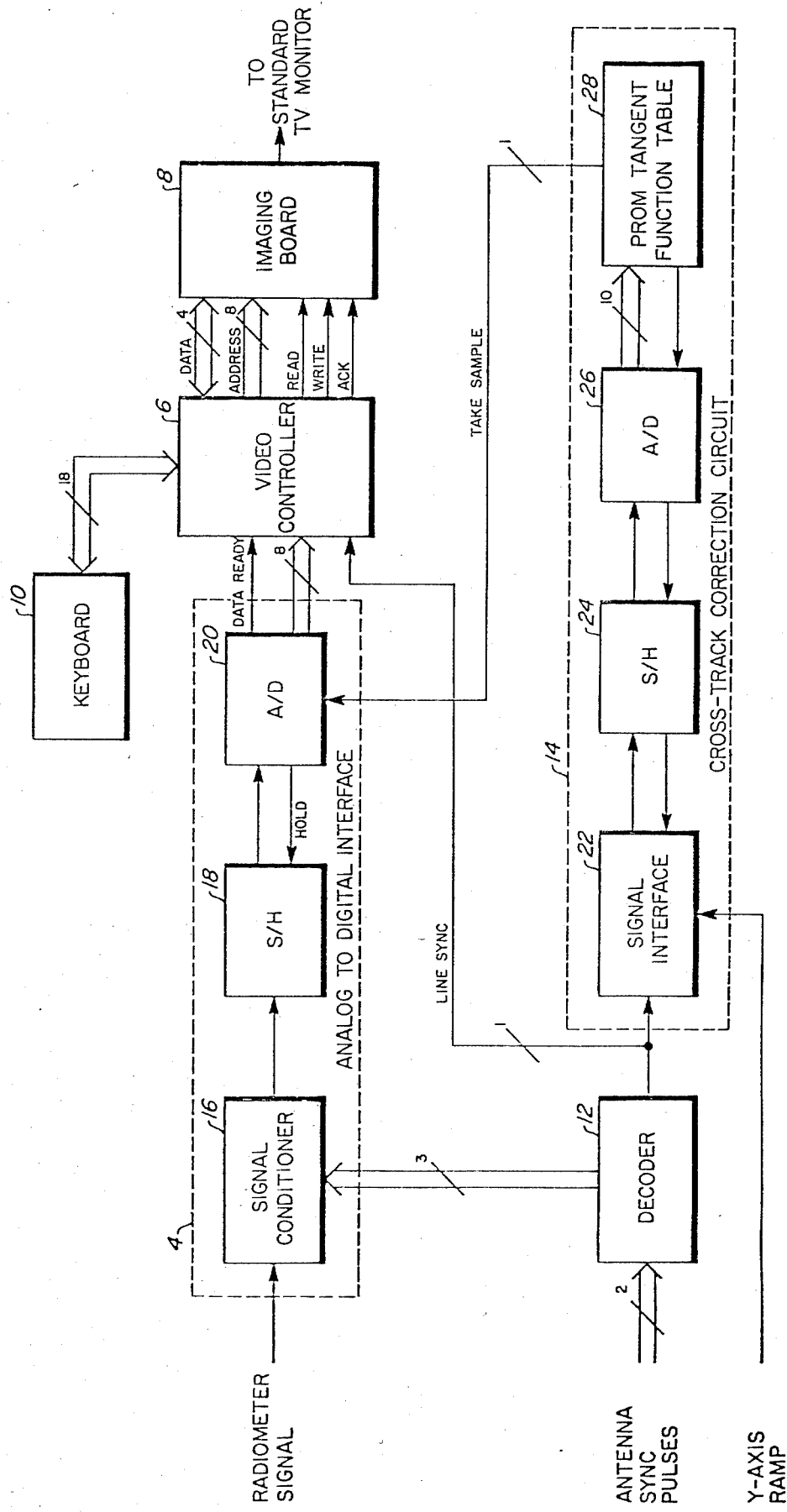
FIG. 2 is a block diagram of the invention.

The moving scene display for passive radiation wave imaging system 2 is shown in greater detail in FIG. 2. The first functional block noted in this figure is the analog to digital interface 4 which consists of a signal conditioner 16, a sample and hold 18 and an analog to digital converter 20. The signal conditioner 16 receives the radiometer signal. The interface to the output of the radiometer is impedance matched by the signal conditioner 16. Because the inputs into the signal conditioner from the radiometer 32 may be of varying magnitudes, (each antenna may produce a slightly different signal) the signal conditioner 16 matches, i.e., amplifies or attenuates, the inputs so that for a given signal all outputs are dynamically matched. For example, if a certain object is scanned by the antenna system 30, the resultant signal produced by the radiometer 32 may be different for each antenna scan due to mismatches between the antennas. The signal conditioner 16 allows these mismatched signals to be dynamically matched so as to be an output of the same magnitude for any scanning antenna. There are gain and offset controls so that such matching of inputs and outputs in a dynamic sense may be determined. Signal conditioner 16 has another input from a decoder 12. This input consists of synch pulses which indicate the particular antenna of antenna system 30 as being in the scan mode. The output of the signal conditioner 16 is fed into the sample and hold 18. The balanced radiometer signals coming out of the signal conditioner 16 are sampled in the sample and hold circuit 18 in a nonlinear fashion, i.e., the sample times vary across the scan. For 100° of scan by an antenna 256 samples are taken. These samples are taken back to back. The sample and hold circuit is of an MN344 type. The output of the sample and hold 18 is fed into the analog to digital converter 20. A signal comes from analog to digital converter 20 to the sample and hold 18 which indicates a hold on the signal. The analog to digital converter 20 digitalizes the sampled radiometric signal. The data rates in the analog to digital converter 20 are dictated by the rotational speed of the antennas 30 which in turn are dictated by the platform velocity and altitude. The digital information from the analog to digital converter 20 is fed into a video controller 6. Within the video controller 6 is a microprocessor in which enters the digital information from the analog to digital converter 20. A data ready signal is sent by the analog to digital converter 20 to the video controller 6 which indicates that the digital information or word is ready to be sent to the video controller 6. This information is sent in the form of an eight bit word.

The main part of the video controller 6 is a microprocessor which acts as an elaborate bookkeeper and housekeeper for the system 2. The microprocessor handles the addressing and controlling of digital words from the analog to digital converter 20 to an imaging board 8. The digital information is that of pixels (picture elements) which are loaded into the imaging board 8. This loading may be done at various rates due to scan of the antenna system 30. Diversified functions through software type control may be performed by the microprocessor within the video controller 6. For instance to highlight objects of a scan image by contrast enhancement a level slicing technique is used. In this technique a particular gray scale is assigned to a designated power level which in turn provides a significantly noticeable output setting forth such object in the display. The microprocessor of the controller 6 is controlled by appropriate software which is easily designed to provide the appropriate gray scale for the pixels, to organize the pixels line for line, to determine the scroll, and to provide various display routines and various signals that coordinate the system. When data are not being fed into the system 2, different software as desired by the user may be used in the microprocessor to pull data out of the imaging board 8 and analyze it and redisplay it in a different format. This connection between the video controller 6 and the imaging board 8 is asynchronous. Other kinds of software may be implemented to control the microprocessor so that it can allow the system to accommodate various sensors in number and kind, i.e., infrared, MICRAD, radar and of the sort. Since pixel rates in the system 2 vary according to antenna position while the antenna is in scan, the rates must be compensated for so that a correct aspect ratio of the image representing a linear scan may be provided. This compensation is provided by the microprocessor in the video controller 6. The microprocessor of the video controller 6 may be a model 6809 microprocessor or another processor in the 6800 series which is available from Motorola, Inc., in Phoenix, Az.

Connected to the video controller 6 is a keyboard 10. Instructions put into the microprocessor may be done by this keyboard 10. For instance one can instruct the microprocessor to pull out certain portions of the image from imaging board 8, rearrange them into another format such as by enlarging or reducing or separating or enhancing aspects of them, and to reenter the result into the imaging board 8 which in turn is sent on from board 8 to the standard television monitor 34. The keyboard 10 is a typical microcomputer alpha-numeric keyboard.

The video controller 6 is interconnected with imaging board 8. Connections include a two-way data port, address lines to the imaging board 8, a read line, a write line and an acknowledge line. Imaging board 8 is a Matrox model RGB-256 which is available from Matrox Electronics Systems, Ltd., in Quebec, Canada. It is a single board graphic controller having a 256 by 256 by 4 bit configuration. This imaging board 8 can easily be expanded to 8 bits of contrast information or color (256 levels) with the addition of another RGB-256 board. Imaging board 8 looks like a dual port RAM (random access memory) with data input and output capabilities controlled by a microprocessor in one port and a data output of the entire matrix to a television encoder for visual display. Basically the imaging board 8 has a memory matrix and an image rate converter as its components. The memory matrix represents cross-track (X), down-track (Y), and contrast information. The input coming from video controller 6 that is put into a memory of the imaging board 8 is converted by the imaging board 8 to a certain television rate and format. All memory data are continuously read and output to the television monitor. The output is a nonmodulated signal. There is a scroll register in the imaging board 8 which is controlled by the microprocessor of the video controller 6. Scrolling is changing the Y reference position on the television output as new data are written over the oldest data in the matrix memory of the imaging board 8. The scroll register provides a moving scene display illusion. Once data have been written into the matrix of the memory and stored, they may also be read out at other than television monitor rates via the microprocessor of the video controller 6.

Also in FIG. 2 is the decoder 12 which has as its input antenna synch pulses. These synch pulses indicate which antenna is scanning for display orientation. The pulses are routed up to the signal conditioner 16 for purposes of providing a consistent dynamic output of signal conditioner 16. The signals within the decoder are decoded indicating the respective scanning antenna for purposes of an output to the cross-track correction circuit 14 and to the video controller 6. The output of the decoder 12 which differentiates one antenna from the other antennas is for the purpose of organized scanning and processing via the radiation wave imaging system 2.

Figure 3:
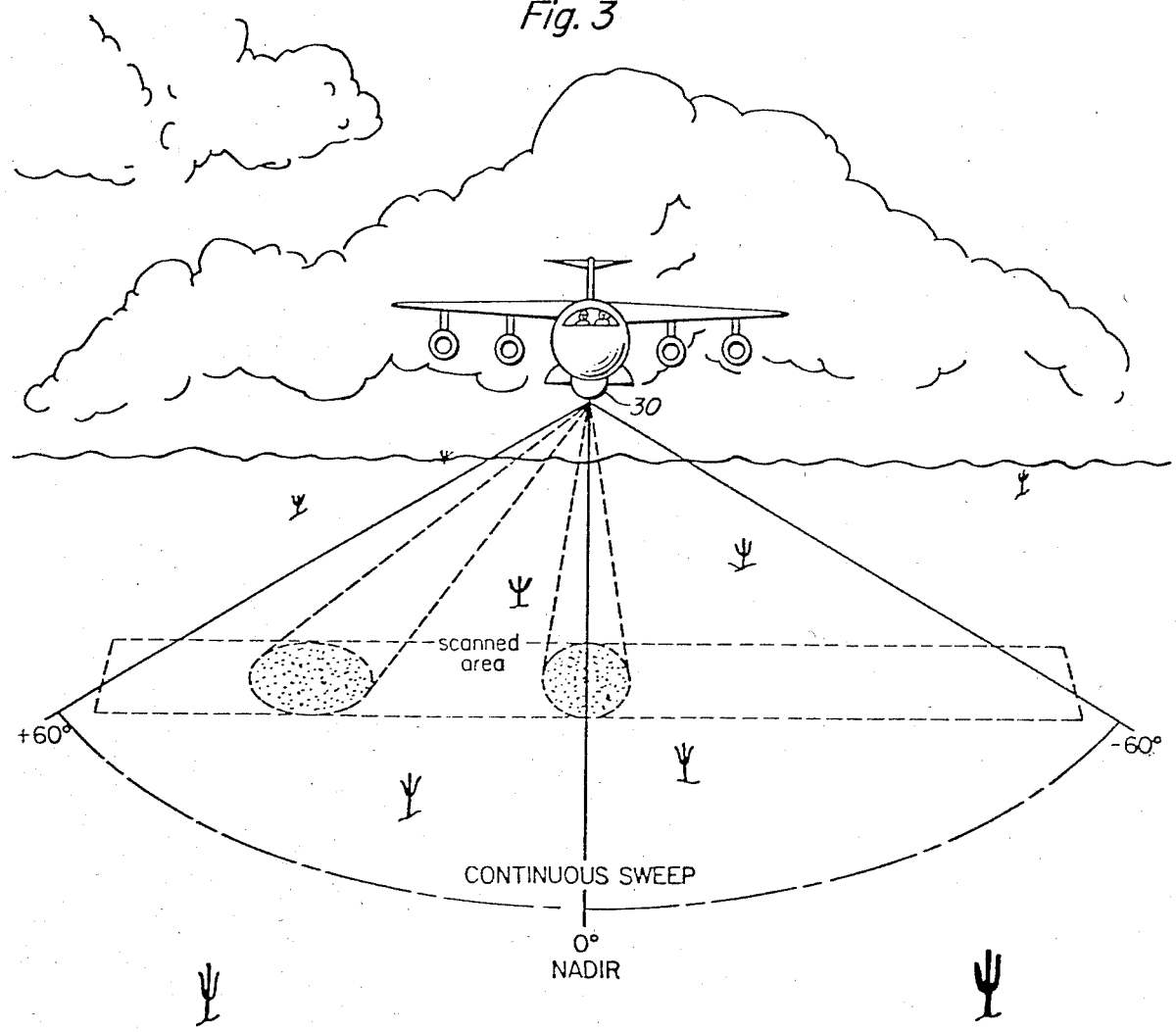
FIG. 3 shows a platform for the invention.
Figure 6:
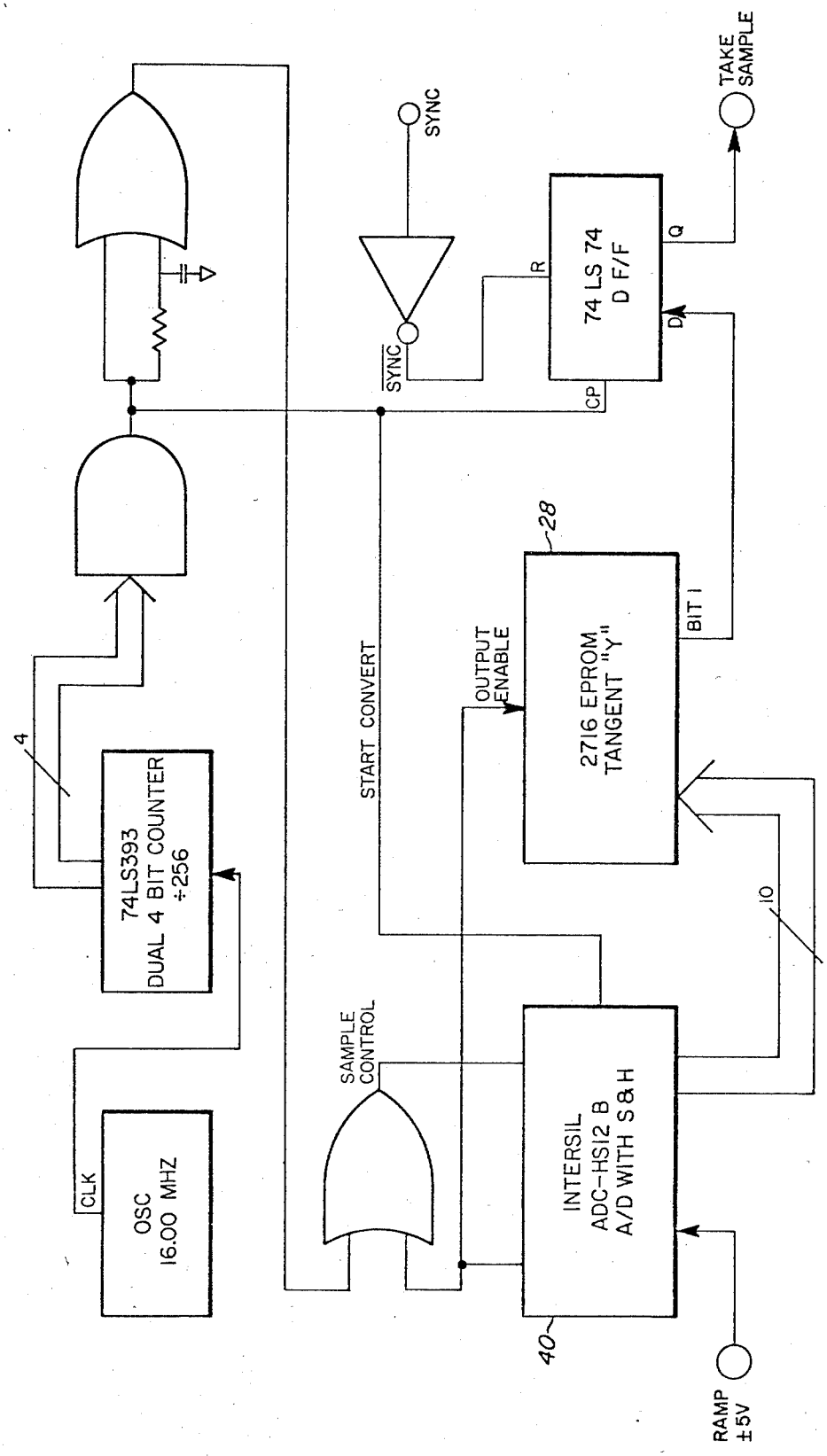
FIG. 6 is a schematic of the cross-track correction circuit.

The cross-track correction circuit 14 of FIG. 2 includes a signal interface 22, a sample and hold 24, an analog to digital converter 26 and a programmable read only memory (PROM) containing a tangent function table 28. Also see FIG. 6. Basically the cross-track correction circuit 14 is to put into perspective the nonlinear characteristics of the scanning antenna 30 against the surface of the earth as seen from the antenna platform which is an aircraft. Referring to FIG. 3, an airborne imaging system 2 includes a unidirectionally rotating scanning antenna 30. This antenna 30 sweeps continuously across the flight path of the aircraft platform from a nominal plus 60°, through a nadir (directly beneath the aircraft at 0°), to minus 60°. Antenna scan rate is set based upon parameters which include aircraft velocity, altitude and desired scan to scan overlap. Once set, the angular velocity of the scanning antenna 30 is constant. Given a constant antenna scan rate and a straight and level flight path over an essentially flat earth, the velocity over the ground of a spot on the earth's surface being observed is constantly changing due to the continuously changing distance between the antenna aperture 30 and the scanned location.

Figure 4:
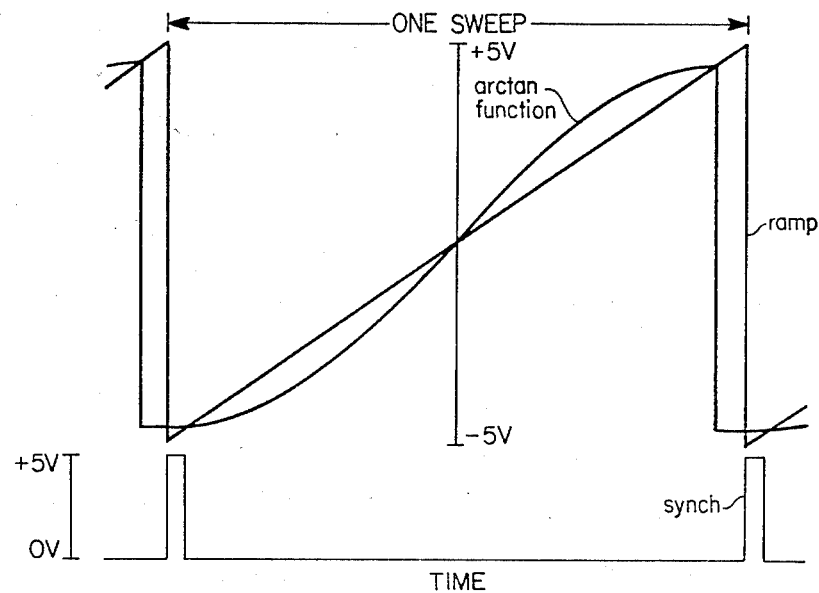
FIG. 4 schematizes the relationship of antenna scan, ramp signal, synch pulse, and trignometric function.

In order to accomplish the preferred construction of an image of the earth's surface based upon data sampled at equidistant locations on that surface, data must be sampled in a controlled, nonlinear fashion during the course of each sweep of the antenna 30. A tangential relationship exists between the antenna scan angle (antenna aperture position with respect to the nadir) and the location of the earth's surface being scanned within the coordinate system shown in FIG. 3. Further, the rotation of the scanning antenna 30 can be associated with a linear ramp function representing a plot of the arc tangent of the antenna aperture 30 as a function of time as noted in FIG. 4. The cross-track correction circuit 14 causes data sampling to occur during each sweep of the antenna 30 as a function of the arc tangent of the linear ramp function associated with the antenna rotation. As a result data are sampled at points equidistant on the ground and an undistorted image is constructed representative of the earth's surface and locations on it.

Into the cross-track correction circuit 14 is fed a Y axis ramp signal for the given respective scanning antenna. This signal is directly proportional to the antenna scan angle. The ramp signal is roll compensated before entry into the correction circuit 14. Roll compensation is for aircraft roll. The circuit 14 performs coordinate transformation of the externally generated linear voltage ramp demonstrated in FIG. 4 utilizing the information stored in PROM 28. PROM 28 is programmed with a tangent function from which correct sample timing information can be extracted. The tangent function is stored in PROM 28.

The signal interface 22 has an input in which the Y axis roll compensated ramp signal arrives. Another input into signal interface 22 is the decoded antenna synch pulse from the decoder 12. The signal interface 22 transforms the incoming signals so that they are acceptable electrically to the sample and hold circuitry 24. The output of the sample and hold 24 goes to the analog to digital converter 26. The resultant 10 bit digital signal from the analog to digital converter 26 is input to the programmable read only memory tangent function table 28. Essentially the input to table 28 is the digitalized ramp signal at one of 1024 levels. Each level is address information to table 28. Both the sample and hold 24 and the analog to digital converter 26 may be an Intersil model ADC-HS12 B device available from Datel/Intersil in Mansfield, Mass. The PROM tangent function table 28 is based on the tangent function of the scan angle as represented by the ramp signal. Table 28 outputs a sampling rate which effectively is a take-sample signal to the analog to digital converter 20 of the analog to digital interface 4. This varying sampling rate compensates for distortions of the beam spot due to angle and speed of the beam on the earth's surface. This rate of variation is illustrated in FIG. 5. The PROM tangent function table 28 may be a type 2716 EPROM (electrically programmable read only memory).

The invention is not limited to the embodiment described above, but all changes and modifications thereof not constituting departures from the spirit and scope of the invention are intended to be included.

What is claimed is:

1. A moving scene display for passive radiation wave imaging system which comprises:
   an analog to digital interface having first, second and third inputs, and having first and second outputs;
   a video controller having a first input connected to the second output of the analog to digital interface, having a second input connected to the first output of the analog to digital interface, having third, fourth, and fifth inputs, and having first, second, third, fourth, fifth, and sixth outputs;
   a keyboard having an input connected to the first output of the video controller and having an output connected to the third input of the video controller;
   an imaging board having a first input connected to the sixth output of the video controller, having a second input connected to the fifth output of the video controller, having a third input connected to the fourth output of the video controller, having a fourth input connected to the third output of the video controller, having a fifth input connected to the second output of the video controller, having a first output connected to the fourth input of the video controller, and having a second output;
   a decoder having an input, having a first output connected to the third input of the analog to digital interface, and having a second output connected to the fifth input of the video controller; and
   a cross-track correction circuit having a first input connected to the second output of the decoder, having a second input, and having an output connected to the second input of the analog to digital interface.

2. A moving scene display for passive radiation wave imaging system, according to claim 1, wherein the analog to digital interface comprises:
   a signal conditioner having a first input, having a second input connected to the first output of the decoder, and having an output;
   a sample and hold having a first input connected to the output of the signal conditioner, having a second input, and having an output; and
   an analog to digital converter having a first input connected to the output of the sample and hold, having a second input connected to the output of the cross-track correction circuit, having a first output connected to the second input of the sample and hold, having a second output connected to the second input of the video controller, and having a third output connected to the first input of the video controller.

3. A moving scene display for passive radiation wave imaging system, according to claim 1, wherein the cross-track correction circuit comprises:
   a signal interface having a first input connected to the second output of the decoder, having a second input, and having an output;
   a sample and hold having a first input connected to the output of the signal interface, having a second input, and having an output;
   an analog to digital converter having an input connected to the output of the sample and hold, having a first output, and having a second output connected to the second input of the sample and hold; and
   a programmable read only memory having an input connected to the first output of the analog to digital converter, and having an output connected to the second input of the analog to digital interface.

* * * * *